United States Patent
Hough et al.

(10) Patent No.: US 8,310,751 B2
(45) Date of Patent: Nov. 13, 2012

(54) METHOD AND APPARATUS FOR MAKING A HIGH RESOLUTION LIGHT PATTERN GENERATOR ON A TRANSPARENT SUBSTRATE

(75) Inventors: Thomas Hough, Dallas, TX (US); James Bornhorst, De Soto, TX (US)

(73) Assignee: Production Resource Group, L.L.C., New Windsor, NY (US)

( * ) Notice: Subject to any disclaimer, the term of this patent is extended or adjusted under 35 U.S.C. 154(b) by 609 days.

(21) Appl. No.: 12/495,484

(22) Filed: Jun. 30, 2009

(65) Prior Publication Data

US 2009/0323032 A1    Dec. 31, 2009

Related U.S. Application Data

(60) Provisional application No. 61/076,822, filed on Jun. 30, 2008.

(51) Int. Cl.
*G02B 5/20* (2006.01)
(52) U.S. Cl. ............................. 359/359; 353/62
(58) Field of Classification Search ............... None
See application file for complete search history.

(56) References Cited

U.S. PATENT DOCUMENTS

| 4,245,003 | A | | 1/1981 | Oransky et al. | |
|---|---|---|---|---|---|
| 4,779,176 | A | * | 10/1988 | Bornhorst | 353/62 |
| 5,728,994 | A | * | 3/1998 | Hutton | 219/121.69 |
| 5,795,058 | A | * | 8/1998 | Owen | 362/293 |
| 5,959,768 | A | | 9/1999 | Hutton | |
| 6,027,849 | A | * | 2/2000 | Vogel | 430/167 |
| 2003/0072161 | A1 | * | 4/2003 | Hough et al. | 362/293 |
| 2009/0316416 | A1 | * | 12/2009 | Bornhorst | 362/319 |

FOREIGN PATENT DOCUMENTS

JP    01267092    10/1989

OTHER PUBLICATIONS

PCT search report,/written opinion, mailed Dec. 3, 2009.

* cited by examiner

*Primary Examiner* — Lee Fineman
(74) *Attorney, Agent, or Firm* — Law Office of Scott C. Harris, Inc.

(57) ABSTRACT

A light pattern generator that can be used to form a gobo for use in a projection optical system. A transparent plate is coated with a stack that is absorptive and reflective. The stack is formed to be ablatable in the form of a pattern. The stack can have multiple different layers with multiple different characteristics, all of which are ablated by the laser.

3 Claims, 3 Drawing Sheets

METHOD AND APPARATUS FOR MAKING A HIGH RESOLUTION LIGHT PATTERN GENERATOR ON A TRANSPARENT SUBSTRATE

The present application claims priority from 61/076,822, filed Jun. 30, 2008, the entire contents of the disclosure of which is herewith incorporated by reference.

BACKGROUND

A significant feature of stage lighting systems is the projection of images by stage lighting instruments. Images are typically formed by passing a light beam through a light pattern generator or "gobo" and projecting the image formed thereby. A gobo therefore operates as a light stencil, blocking certain portions of the light beam and passing other portions. A typical configuration for projecting a pattern of light has a gobo placed in a projection gate located at a focal plane of a projection lens and illuminated by a light source. A typical theatrical lighting projector, also called a luminaire comprises a light source, a reflector which focuses light rays to the focal plane, and one or more lenses to project an image of the gobo at the focal plane.

It is desirable to make the projector, and thus the gobos, as small as possible. For this reason, it is often necessary to focus the source's energy into a very small area. This creates intense heat at the focal plane. Typically, heat resistant gobos have been fabricated as a layer of light reflective materials, such as aluminum deposited on a surface of a transparent plate such as heat resistant glass. The light reflective layer has an opening which is in the shape of the image. A portion of the light beam passes through the opening to produce a beam having the shape of the image. The reflective layer serves to reflect a portion of the light beam which does not pass through the opening.

Glass gobos of this type are very resistant to the intense heat present at the projection lens focal plane. Glass gobos of this type are manufactured by a relatively expensive and time-consuming process, e.g., that described in U.S. Pat. No. 4,779,176.

The process described in U.S. Pat. No. 4,779,176 requires a layer of positive photoresist material to be deposited in the shape of a desired image onto a large, thin sheet of transparent glass. A thin layer of aluminum is then deposited over the glass and the photo resist layer. A multi-layer dielectric coating deposited over the aluminum layer forms a "dark mirror", which is a low reflectivity surface that absorbs visible light. The glass sheet and the various coatings are then exposed to solvents which dissolves the photo resist and lifts all the layers of material immediately over the photo resist while having no effect on the glass. The solvents etch process produces an opening through the deposited layers which is in the shape of the desired image.

This process requires fabricating a photo mask having the desired image formed therein to facilitate deposition of the photo resist layer. Due to the significant lead times required to manufacture the photo mask, and thus the finished gobos, this process is not typically suitable for small, "made-to-order" production runs.

In an effort to overcome the expense and time required to quickly produce glass gobos, prior art methods have employed a laser operating in the near IR to ablate reflective material from a transparent substrate. Such methods are described in U.S. Pat. No. 5,728,994.

As described in U.S. Pat. No. 5,728,994, a light reflective layer is deposited on a surface of a transparent plate. A laser marking system writes an image onto the transparent plate having a reflective layer bonded thereto. The reflective layer is highly reflective to visible light and is absorptive of certain wavelengths of near infra-red radiation, in the range of 850 to 2000 nm. The reflective layer of the blank gobo absorbs the energy of the laser beam and is ablated away from the transparent plate, leaving an opening in the shape of the desired image. The reflective layer can be a four-layer stack of enhanced aluminum, applied by a vacuum-deposition process to produce a coating that is highly reflective of visible light, absorptive of near infra-red radiation at 1.06 micrometers, and stable at high temperatures.

This prior art operated by depositing on a transparent plate a layer of reflective material which reflects visible light and absorbs certain wavelengths of near infra-red radiation; generating a laser beam having a given beam diameter at a certain infra-red wavelength. It may also direct the laser beam onto the transparent plate; steering the laser beam across a surface of the transparent plate; allowing the energy of the beam to ablate reflective material from certain areas of the reflective layer; and switching the laser beam on and off to control which areas of the reflective layer are affected by the laser beam.

Drawbacks of the IR method include:
 1. Back reflections
 2. Low resolution
 3. Requires the use of a high maintenance laser, water cooled, etc.

1.06 micron lasers are large, and require water cooling. Therefore they are expensive to maintain, and the minimum spot size is governed by the wavelength of the laser. Typically, this can be, for example, 0.001" when written over a 1.0" diameter field of view. The resulting imagery is coarse.

SUMMARY OF THE INVENTION

The minimum diameter of a spot of focused laser energy is directly dependent on the laser wavelength. The inventors recognize that use of a UV laser allows for smaller spot sizes than IR lasers and therefore produce ablated gobo images with higher resolution.

Embodiments describe projection optical systems, particularly used the projection of images by stage lighting equipment and to a method and apparatus for making a high resolution light pattern generator on a transparent substrate for use in such equipment.

DETAILED DESCRIPTION

Figure 1:
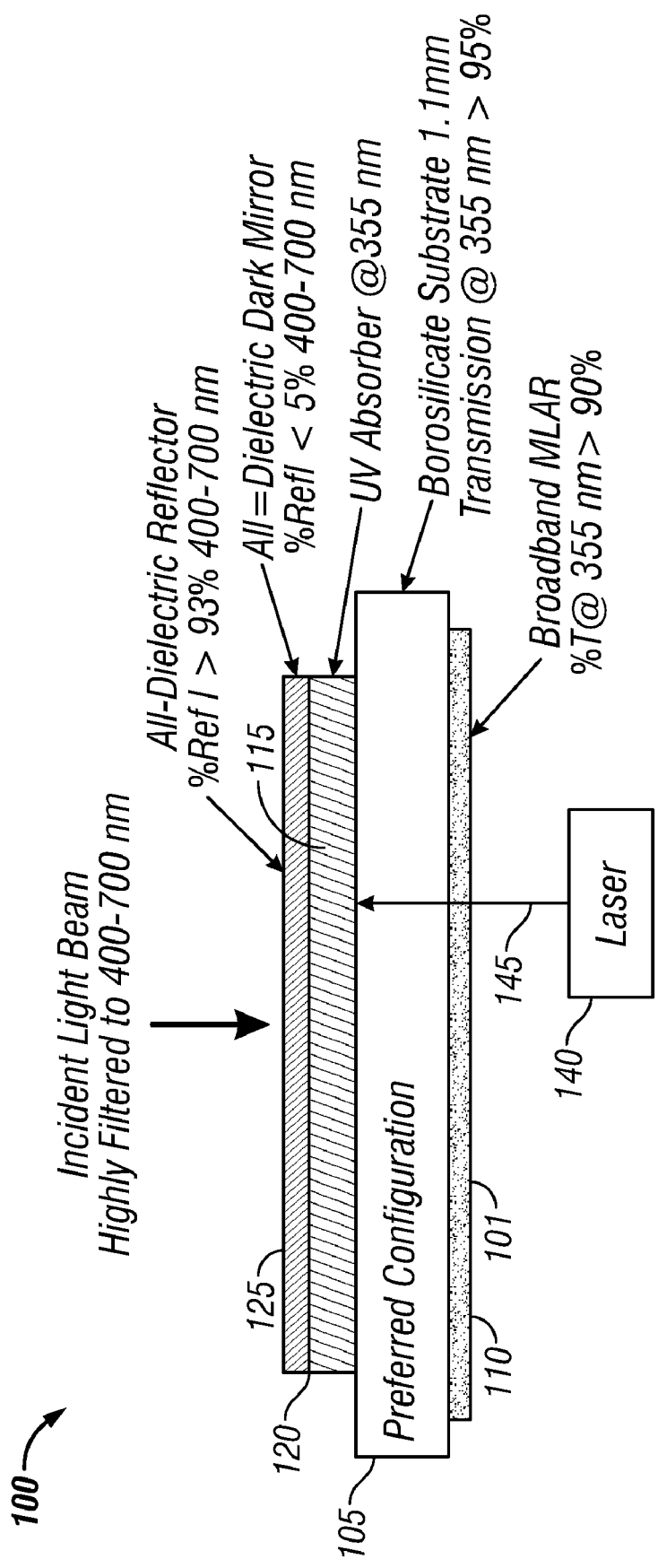
FIG. 1 shows an embodiment of a substrate for gobos.

An embodiment describes a light pattern generator for projecting an image with a light beam, where the object to be imaged is a gobo which shapes the light beam.

The generator 100 includes a transparent substrate 105 for placement in the light beam with selective coatings on certain areas to form the image. The transparent substrate 105 may be a borosilicate glass of approximately 1.1 mm thickness, having a transmission of about 95% at 355 mm. This substrate 105 is coated on the front side with a high efficiency anti-reflective ("HEAR") coating that is highly transmissive in the 355 nm to 700 nm range. The transparent substrate 105 is coated on the rear side with a "release layer" 115 that is highly light absorptive (e.g., greater than 90%) at 355 nm. On top of that is a dark mirror coating 120 that is highly absorptive in the 400 nm to 700 nm region of the spectrum is coated on the release layer 115. This is covered by a dielectric reflector 125.

A laser 140 produces laser light 145 at 355 nm which is focused on the front side 101 of the coated substrate 100. The laser light is conveyed through the substrate, due to the high transmittance of the HEAR coating 110. The laser radiation then contacts the release layer 115, which is vaporized in the location of the laser application. This thus ablates the release layer, the dark mirror coating, and the highly reflective coating. By pulsing the laser and moving the beam, an image is written onto the generator 100, thereby forming a gobo from the substrate.

An alternative embodiment may be similar to that in the above, with the HEAR and UV absorber layers removed.

Figure 4:
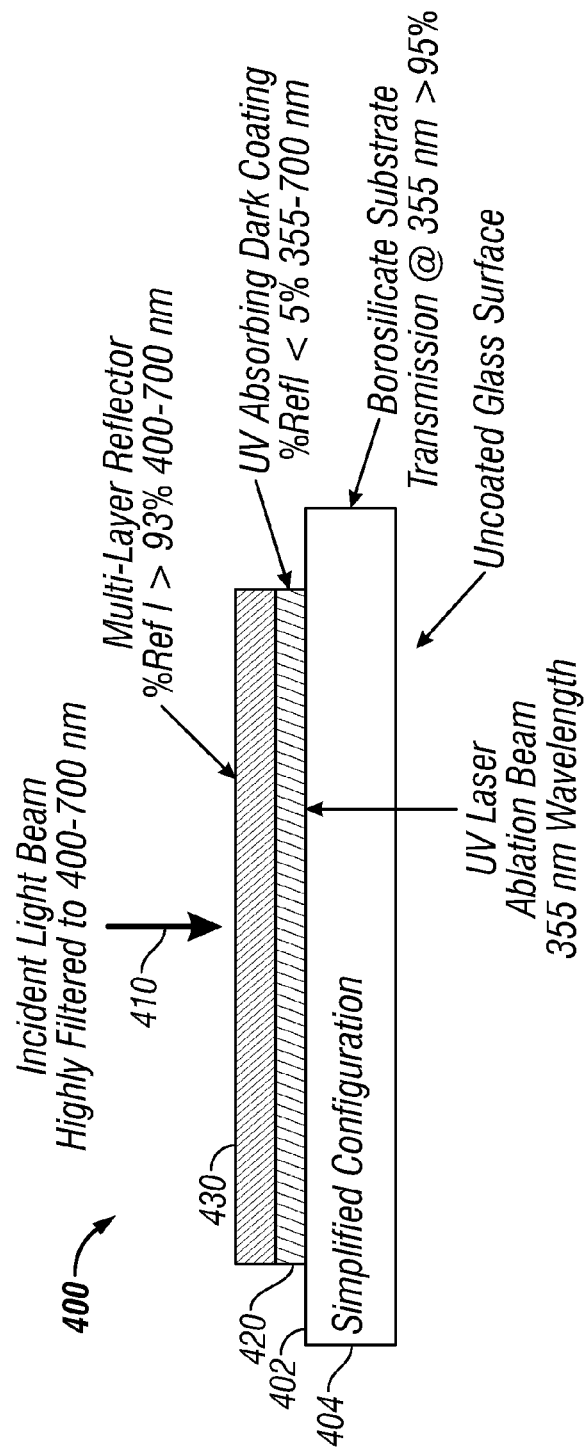
FIG. 4 shows an alternative configuration.

FIG. 4 shows an embodiment where there is a "simplified" configuration. A substrate of borosilicate glass 400 is formed with a top surface 402 that faces to the incident light beam, and a bottom uncoated surface 404. The borosilicate substrate has a transmission at 355 nm of greater than 95%. The top surface 402 is covered with a UV absorbing dark coating 420 that absorbs most of the incoming light, e.g, reflects less than 5% of incoming light (355-700 nm). The coating 420 is covered with a multi layer reflector layer 430 which is formed of multiple layers of reflector elements. The multi layer reflector may reflect more than 93% of 400-700 nm radiation.

Figure 2:
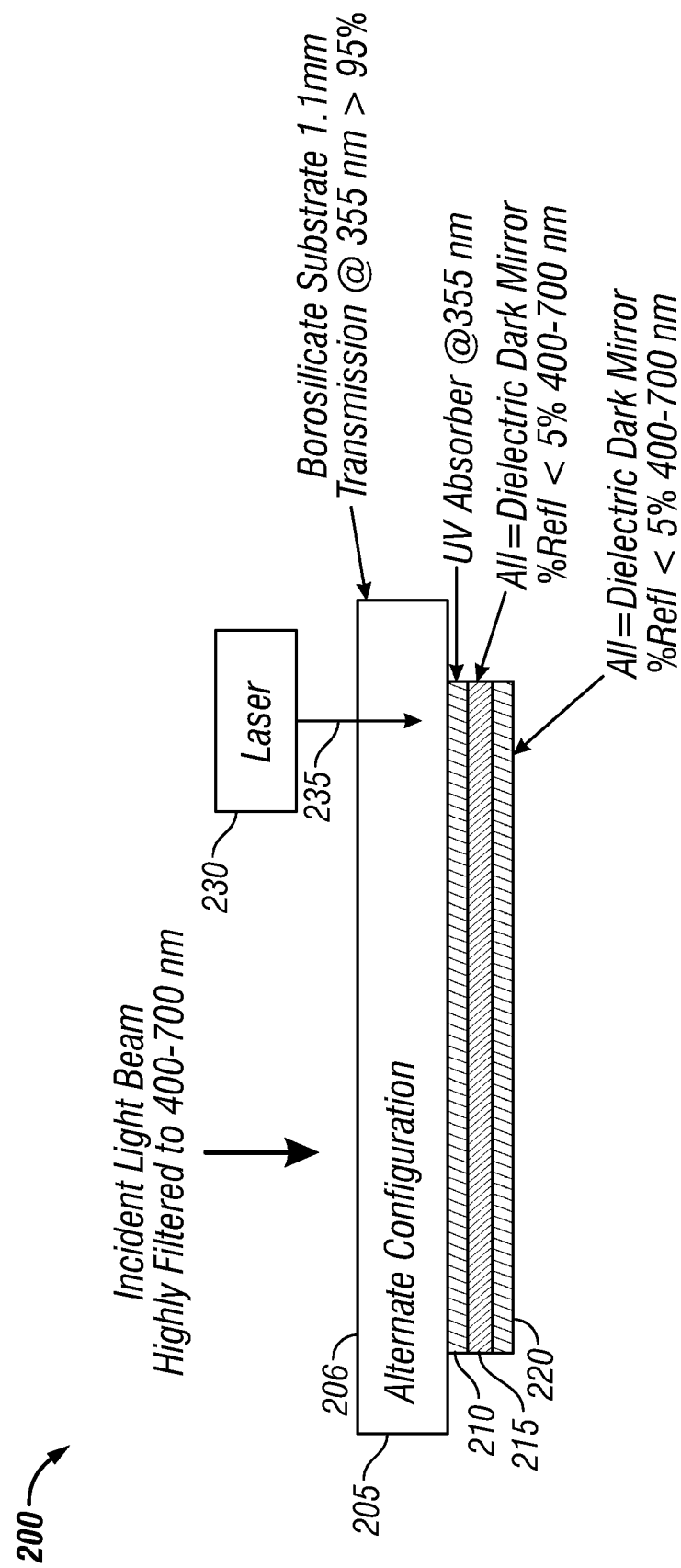
FIG. 2 shows an alternate configuration which ablates from the same side as the light beam is incident.

Yet another embodiment 200, shown in FIG. 2, includes a transparent substrate 205 for placement in the light beam. The transparent substrate 205 is uncoated on the front side 206 (which is the side that receives the incident light beam). The transparent substrate is coated on the rear side with a "release layer" 210 that is highly absorptive at 355 nm. On top of the release layer 210 is a reflective coating 215 that is highly reflective in the region of 400 nm to 700 nm. On top of that is a dark mirror coating 220 that is highly absorptive in the 355 nm to 700 nm region of the spectrum.

A UV laser 230 creates laser light 235 at 355 nm which is focused on the front side 206 of the coated substrate. The laser light is conveyed through the substrate and contacts the release layer 210. The laser vaporizes and ablates the release layer, the highly reflective coating, and the dark mirror coating. By pulsing the laser and moving the beam, an image is written onto the device, thus forming a gobo.

Figure 3:
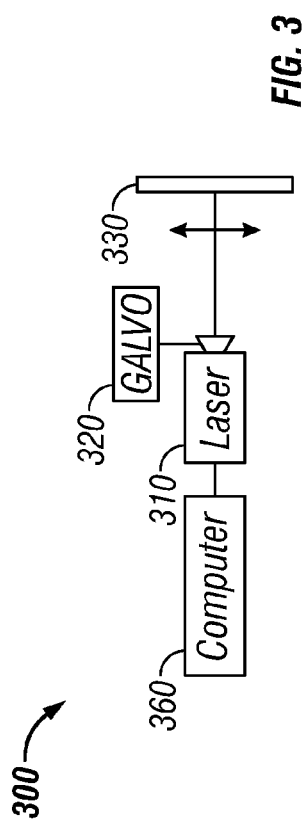
FIG. 3 shows a system of forming the gobo.

Another aspect of shown in FIG. 3 comprises an apparatus for making a light pattern generator. The apparatus includes a general purpose computer 300, a laser marking system 310 at operating in the UV region at 355 nm, and a galvo system 320 for steering the focused laser beam across the substrate 330. The general purpose computer 300 serves as a host computer interface to the laser marking system and galvo systems. The laser marking system writes an image onto a transparent plate having a reflective layer bonded thereto, the image being dependent upon digital computer data selected at the host computer interface and loaded into a control unit of the laser marking system. The laser beam has a very narrow beam diameter and a characteristic wavelength in the near UV region.

The absorbing layer of the blank gobo is absorptive to the energy of the laser beam and is ablated away from the transparent plate, along with the reflective coating, leaving an opening in the shape of the desired image.

Another aspect comprises a method for making a light pattern generator. The method includes the steps of: depositing on a transparent plate a layer of reflective material which reflects visible light, absorbing material that absorbs visible light, a release layer that absorbs certain wavelengths of near UV radiation, and a HEAR layer, and; generating a laser beam having a very small beam diameter at a certain UV wavelength; directing the laser beam onto the transparent plate; steering the laser beam across a surface of the transparent plate; allowing the energy of the beam to ablate absorbing material from certain areas of the reflective layer, which in turn blows off the reflective material; and switching the laser beam on and off to control which areas of the reflective layer are affected by the laser beam.

Although only a few embodiments have been disclosed in detail above, other embodiments are possible and the inventors intend these to be encompassed within this specification. The specification describes specific examples to accomplish a more general goal that may be accomplished in another way. This disclosure is intended to be exemplary, and the claims are intended to cover any modification or alternative which might be predictable to a person having ordinary skill in the art. For example, other forms of lighting devices can be used and other materials can be used.

Those of skill would further appreciate that the various illustrative logical blocks, modules, circuits, and algorithm steps described in connection with the embodiments disclosed herein may be implemented as electronic hardware, computer software, or combinations of both. For example, this can be used for the blocks that control the laser to make the pattern on the substrate. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein, may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. These devices may also be used to select values for devices as described herein.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Also, the inventors intend that only those claims which use the words "means for" are intended to be interpreted under 35 USC 112, sixth paragraph. Moreover, no limitations from the specification are intended to be read into any claims, unless those limitations are expressly included in the claims. The computers described herein may be any kind of computer, either general purpose, or some specific purpose computer such as a workstation. The programs may be written in C, or Java, Brew or any other programming language. The programs may be resident on a storage medium, e.g., magnetic or optical, e.g. the computer hard drive, a removable disk or media such as a memory stick or SD media, or other removable medium. The programs may also be run over a network, for example, with a server or other machine sending signals to the local machine, which allows the local machine to carry out the operations described herein.

Where a specific numerical value is mentioned herein, it should be considered that the value may be increased or decreased by 20%, while still staying within the teachings of the present application, unless some different range is specifically mentioned. Where a specified logical sense is used, the opposite logical sense is also intended to be encompassed.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A method of making a light pattern generator for use in a projection optical system, comprising:
    applying a layer of material transparent to near ultraviolet ("UV") and visible light to a front side of a transparent substrate;
    applying a first layer of UV absorbing material transparent to visible light to a rear side of the transparent substrate;
    applying a second layer of material that is substantially absorptive to visible light to the rear side of the transparent substrate;
    applying a third layer of material that is substantially reflective to visible light to the rear side of the transparent substrate; and
    directing a UV laser beam onto the transparent plate; and
    steering the UV laser beam across the front surface of the transparent plate to ablate the second and third layers of material from selected areas of the rear surface of the transparent plate to form a pattern.

2. A method of making a light pattern generator for use in a projection optical system, comprising:
    applying a first layer of ultraviolet ("UV") absorbing material transparent to visible light to a rear side of a transparent substrate;
    applying a second layer of material that is substantially absorptive to visible light to the rear side of the transparent substrate;
    applying a third layer of material that is substantially reflective to visible light to the rear side of a transparent substrate; and
    directing a UV laser beam onto the front side of the transparent plate; and
    steering the UV laser beam across the front side of the transparent plate to ablate the second and third layers of material from selected areas of the rear side of the transparent plate to pattern said selected areas.

3. A method for making a light pattern generator comprising:
    depositing on a transparent plate a layer of reflective material which reflects visible light, absorbing material that absorbs visible light, a release layer that absorbs certain wavelengths of near ultraviolet ("UV") radiation, and a high efficiency anti-reflective layer;
    generating a laser beam having a minimal beam diameter at a UV wavelength;
    directing the laser beam onto the transparent plate; steering the laser beam across a surface of the transparent plate;
    allowing the energy of the beam to ablate absorbing material from certain areas of the reflective layer, which in turn blows off the reflective material; and
    switching the laser beam on and off to control which areas of the reflective layer are affected by the laser beam.

\* \* \* \* \*